United States Patent
Bhaskaran et al.

(10) Patent No.: US 11,972,834 B2
(45) Date of Patent: Apr. 30, 2024

(54) LOW POWER AND ROBUST LEVEL-SHIFTING PULSE LATCH FOR DUAL-POWER MEMORIES

(71) Applicant: Qualcomm Incorporated, San Diego, CA (US)

(72) Inventors: Adithya Bhaskaran, Austin, TX (US); Rahul Sahu, Bangalore (IN); Sharad Kumar Gupta, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 147 days.

(21) Appl. No.: 17/774,138

(22) PCT Filed: Nov. 9, 2020

(86) PCT No.: PCT/US2020/059708
§ 371 (c)(1),
(2) Date: May 3, 2022

(87) PCT Pub. No.: WO2021/096809
PCT Pub. Date: May 20, 2021

(65) Prior Publication Data
US 2022/0293148 A1    Sep. 15, 2022

(30) Foreign Application Priority Data
Nov. 11, 2019   (IN) .............................. 201941045726

(51) Int. Cl.
*G11C 7/10*   (2006.01)
*G11C 7/22*   (2006.01)

(52) U.S. Cl.
CPC .......... *G11C 7/1087* (2013.01); *G11C 7/1012* (2013.01); *G11C 7/1084* (2013.01); *G11C 7/222* (2013.01)

(58) Field of Classification Search
CPC ....................................................... G11C 7/222
See application file for complete search history.

(56) References Cited

U.S. PATENT DOCUMENTS

| | | |
|---|---|---|
| 7,443,223 B2 | 10/2008 | Bajkowski et al. |
| 7,768,294 B2 | 8/2010 | Shimazaki et al. |
| 7,839,170 B1 | 11/2010 | Yang et al. |
| 8,638,153 B2 | 1/2014 | Ge et al. |
| 9,564,901 B1 * | 2/2017 | Chow .............. H03K 19/01855 |
| 9,607,674 B1 * | 3/2017 | Narasimhan .............. G06F 1/04 |
| 9,891,283 B2 | 2/2018 | Kim et al. |

(Continued)

OTHER PUBLICATIONS

International Search Report and Written Opinion—PCT/US2020/059708—ISA/EPO—dated Feb. 17, 2021.

*Primary Examiner* — Douglas King
(74) *Attorney, Agent, or Firm* — QUALCOMM Incorporated

(57) ABSTRACT

A level-shifting pulse latch is provided for a self-timed memory clock signal for a memory. The level-shifting pulse latch includes a system-power-domain-to-memory-power-domain level-shifter that inverts and level-shifts a system clock signal into an inverted version of the system clock signal. A pass transistor controls whether the inverted version of the system clock signal drives a memory-power-domain latch to produce the self-timed memory clock signal.

25 Claims, 5 Drawing Sheets

(56) References Cited

U.S. PATENT DOCUMENTS

| | | | |
|---|---|---|---|
| 2013/0223178 A1* | 8/2013 | Terzioglu | G11C 8/10 |
| | | | 365/230.06 |
| 2013/0257498 A1* | 10/2013 | Ge | G06F 1/04 |
| | | | 327/170 |
| 2013/0339775 A1* | 12/2013 | Shaeffer | G11C 11/4087 |
| | | | 713/323 |
| 2014/0025981 A1 | 1/2014 | Evans et al. | |
| 2017/0331463 A1* | 11/2017 | Wang | G06F 1/26 |
| 2019/0103858 A1 | 4/2019 | Yang et al. | |
| 2021/0336609 A1* | 10/2021 | Chen | G11C 11/417 |

* cited by examiner

LOW POWER AND ROBUST LEVEL-SHIFTING PULSE LATCH FOR DUAL-POWER MEMORIES

CROSS-REFERENCE TO RELATED APPLICATIONS

The present application is a 35 U.S.C. 371 National Phase entry of Patent Cooperation Treaty (PCT) Application No. PCT/US2020/059708 filed Nov. 9, 2020, which claims priority to Indian Provisional Patent Application No. 201941045726 filed Nov. 11, 2019, which are hereby incorporated by reference in their entirety.

TECHNICAL FIELD

This application relates to embedded memories, and more particularly to a low power and robust level-shifting pulse latch for embedded dual-power memories.

BACKGROUND

It is conventional for a memory such as an SRAM to be self-timed. For example, the assertion of a word line for a read or write operation is triggered by a self-timed memory clock signal that is asserted responsive to an assertion of a system clock signal. But the self-timed memory clock signal has a duty cycle that is independent of the system clock signal's duty cycle. In particular, the self-timed memory clock signal is reset responsive to the completion of a memory function.

To produce the self-timed memory clock signal, it is conventional to use a pulse latch that asserts the self-timed memory clock signal in response to the assertion of the system clock signal and resets the self-timed memory clock signal once the word line may be released. The pulse latch thus pulses the self-timed memory clock signal so as to have a pulse width that satisfies the required duty cycle. But the system clock signal is generated in a system power domain powered by a system power supply voltage that is independent of a memory power supply voltage for powering the memory. The pulse latch must thus be a level-shifting pulse latch. Due to the need to level-shift, conventional level-shifting pulse latches suffer from excessive power loss, particularly in scenarios in which the system power supply voltage is higher than the memory power supply voltage.

SUMMARY

In accordance with a first aspect of the disclosure, a level-shifting pulse latch is provided that includes: a level-shifting inverter configured to invert and level-shift a system clock signal from a system power domain powered by a system power supply voltage into a memory-power-domain inverted clock signal for a memory power domain powered by a memory power supply voltage; a pass transistor configured to switch on to pass the memory-power-domain inverted clock signal to form a latch input signal on an input signal node responsive to an assertion of both a memory select signal for a selection of a memory in the memory power domain and of the system clock signal; and a memory-power-domain latch configured to latch the latch input signal to provide a self-timed memory clock signal for the memory.

In accordance with a second aspect of the disclosure, a method of operation for a level-shifting pulse latch is provided that includes the acts of: inverting and level-shifting a system clock signal from a system power domain powered by a system power supply voltage into a memory-power-domain inverted clock signal for a memory power domain powered by a memory power supply voltage; passing the memory-power-domain inverted clock signal to form a latch input signal responsive to an assertion of both a memory select signal for the selection of a memory in the memory power domain and an assertion of a system clock signal from the system power domain; and inverting the latch input signal to provide a self-timed memory clock signal for the memory.

In accordance with a third aspect of the disclosure, a level-shifting pulse latch is provided that includes: a system-power-domain latch configured to latch a memory select signal to form a pass transistor control signal; a clock path circuit configured to produce a pair of internal clock signals to control the system-power-domain latch to be transparent while a system clock signal is discharged and a reset signal is not asserted, and to control the system-power-domain latch to be closed while the system clock signal is charged to the system power supply voltage; a pass transistor configured to switch on to pass an inverted version of the system clock signal to form a latch input signal on an input signal node responsive to an assertion of the pass transistor control signal, and a memory-power-domain latch configured to latch the latch input signal to provide a self-timed memory clock signal for a memory.

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
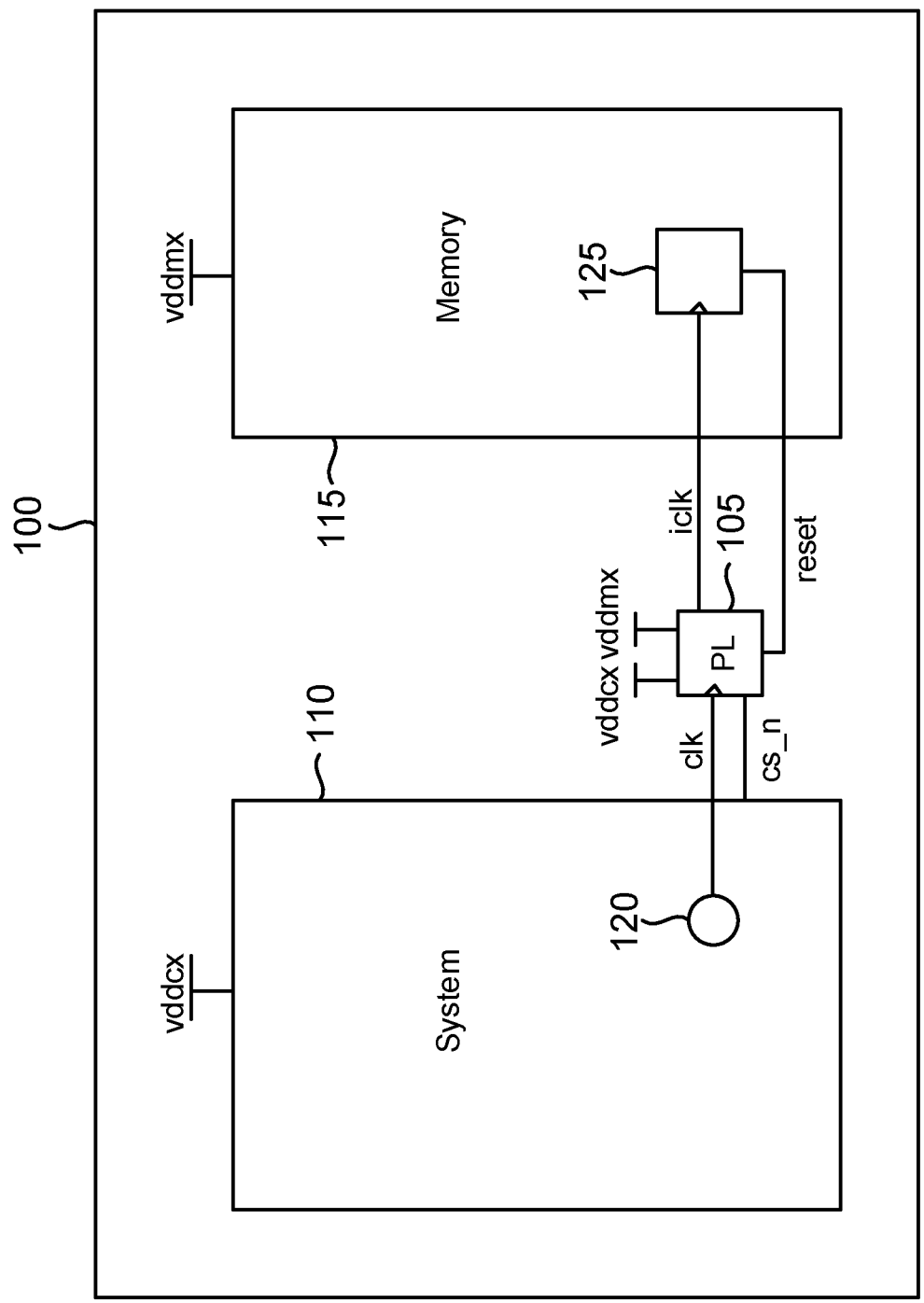
FIG. 1 is a diagram of a system-on-a-chip including a level-shifting pulse latch for a self-timed memory clock signal for an embedded memory in accordance with an aspect of the disclosure.

A system-on-a-chip (SoC) 100 including an example level-shifting pulse latch (PL) 105 is shown in FIG. 1. As used herein, the term "latch" refers to any suitable storage element that may either be synchronous (e.g., a register or flip-flop) or asynchronous (e.g. a reset-set latch). In SoC 100, a system 110 is powered by a system power supply voltage vddcx that is independent of a memory power supply voltage vddmx that powers an embedded memory 115. Embedded memory 115 may thus also be denoted as a dual-power memory since its memory power supply voltage vddmx is independent of the system power supply voltage vddcx. Because of this independence, the system power supply voltage vddcx may be greater than or less than the memory power supply voltage vddmx. Since SoC 100 will typically include multiple embedded memories, system 110 controls access to a specific embedded memory such as embedded memory 115 by asserting a corresponding memory select signal. In SoC 100, the memory select signal for embedded memory 115 is an active-low memory select signal cs_n but it will be appreciated that active-high memory select signals may be implemented in alternative embodiments. In that regard, signals disclosed herein will be deemed to be "asserted" when their binary state is true, regardless of whether the signals are active-high signals or active-low signals. An active-low signal is thus asserted by being discharged and de-asserted by being charged to a power supply voltage. Conversely, an active-high signal is asserted by being charged to a power supply voltage and de-asserted by being discharged. System 110 triggers access (either a read or a write operation) to embedded memory 115 by asserting the memory select signal cs_n. The read or write operation for the memory access then occurs responsive to a rising edge of a system clock signal (clk) from a clock source 120. In alternative embodiments, the memory access may be triggered responsive to a falling edge of the system clock signal clk.

Since the operation of level-shifting pulse latch 105 is independent of whether the memory access is a read or a write operation, the following discussion will refer to a memory access operation as a generic term to denote both a read operation or a write operation for embedded memory 115. With the memory select signal cs_n and the system clock signal clk both asserted, level-shifting pulse latch 105 asserts a self-timed memory clock signal iclk to trigger the memory access operation in embedded memory 115. This assertion of the self-timed memory clock signal iclk is a level-shifting assertion since the system clock signal clk is a system-power-domain signal powered by the system power supply voltage vddcx whereas the self-timed memory clock signal is a memory power domain signal powered by the memory power supply voltage vddmx. As used herein, the terms "system power domain" and "system" are used interchangeably. Similarly, the terms "memory power domain" and "memory" are used interchangeably herein. It will be appreciated that embedded memory 115 may instead be an external memory to SoC 100 in alternative implementations as opposed to being embedded in SoC 100.

Within embedded memory 115, the assertion of the self-timed memory clock signal iclk causes the assertion of a word line voltage for a word line (not illustrated). But the word line is only asserted for a period as timed by a self-timed circuit 125 (e.g., a dummy word line and a dummy bit line) for the completion of a memory function. Once the self-timed circuit 125 times a period sufficient for the completion of the memory access operation, self-timed circuit 125 asserts a reset signal (for example, an active-low reset signal) that causes level-shifting pulse latch 105 to reset the self-timed memory clock signal iclk. The duty cycle of the self-timed memory clock signal iclk is thus independent of duty cycle for the system clock signal clk. Because of this independence, the system clock signal clk may reset prior to the reset of the self-timed memory clock signal iclk. To keep the self-timed memory clock signal iclk asserted despite the reset of the system clock signal clk, level-shifting pulse latch 105 latches the asserted self-timed memory clock signal iclk. This latched assertion of the self-timed memory clock signal iclk is only released when the reset signal is asserted.

Figure 2A:
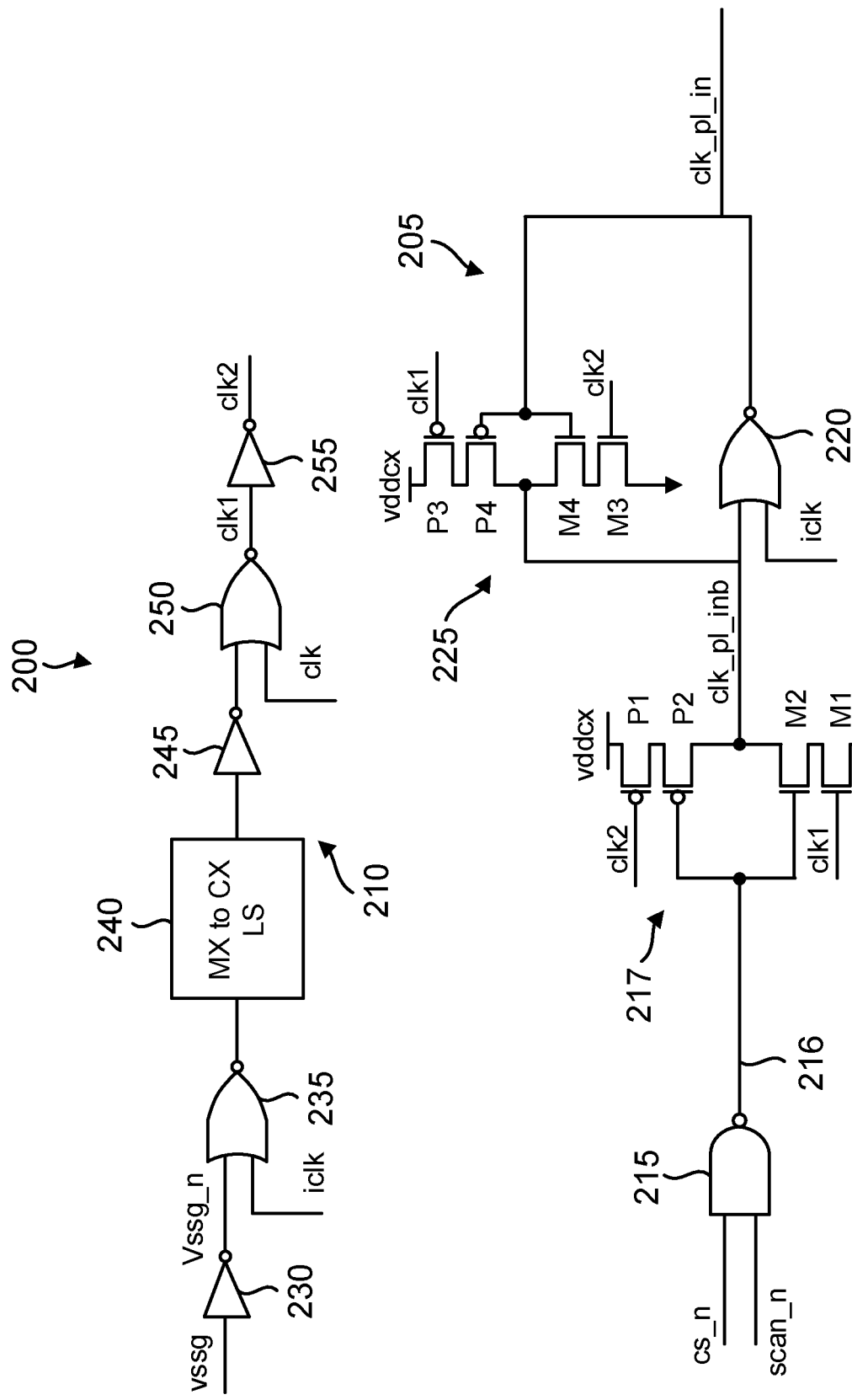
FIG. 2A is a circuit diagram of a first portion of a level-shifting pulse latch in accordance with an aspect of the disclosure.
Figure 2B:
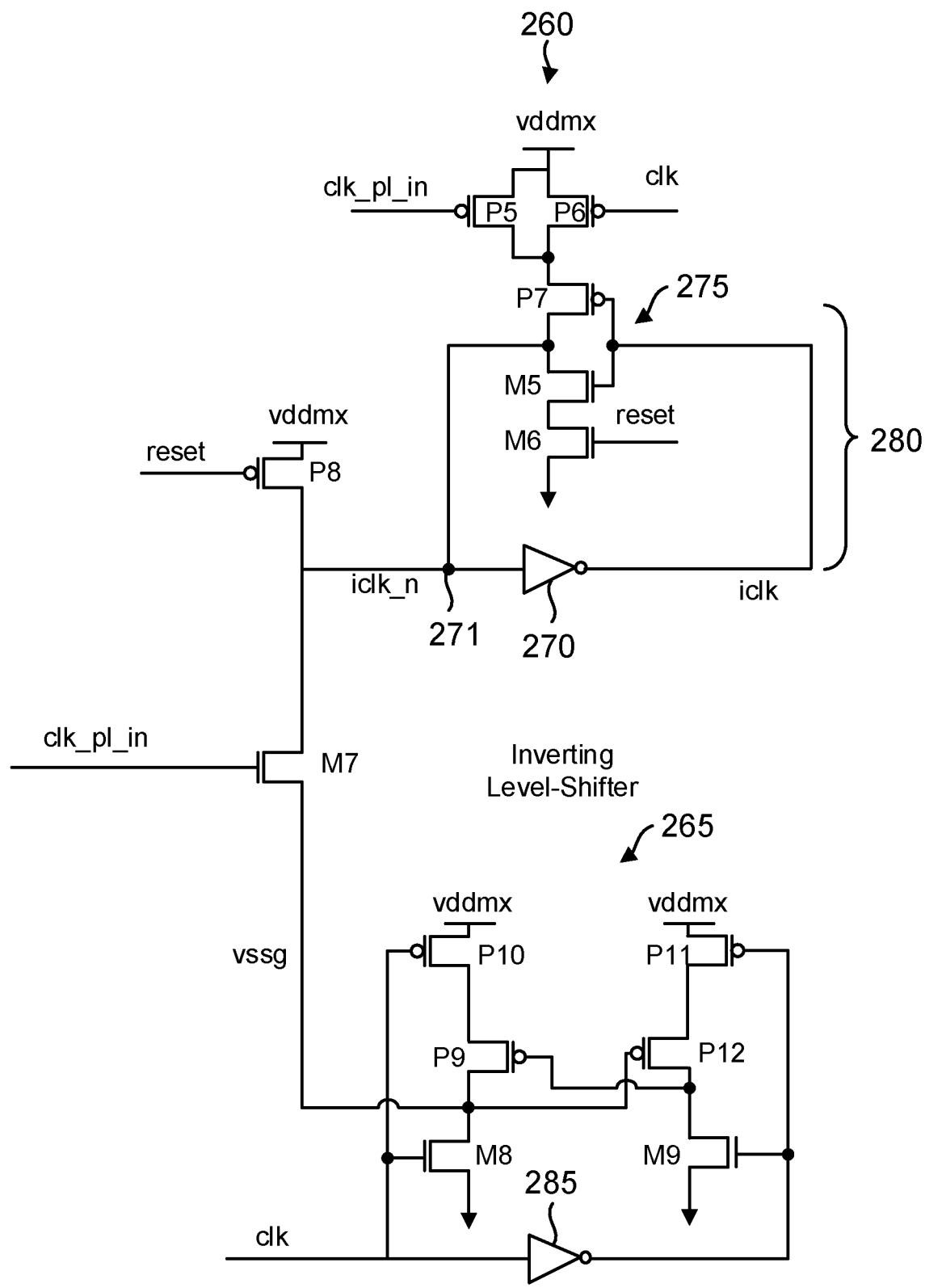
FIG. 2B is a circuit diagram of a second portion of a level-shifting pulse latch in accordance with an aspect of the disclosure.

Level-shifting pulse latch 105 has no control over the system clock signal clk so it must be robust to various skew values for the system clock signal clk. In addition, the level-shifting has traditionally caused substantial power loss for various corner conditions. The improvements in level-shifting pulse latch 105 that reduce power consumption for these corner conditions may be better appreciated with reference to a first portion 200 of level-shifting pulse latch 105 shown in FIG. 2A and to a second portion 260 of level-shifting pulse latch 105 shown in FIG. 2B. First portion 200 includes a system-power-domain latch 205 that latches a pass transistor control signal clk_pl_in. To generate the pass transistor control signal clk_pl_in, the first portion 200 includes a NAND gate 215 that NANDs a memory select signal cs_n with an active-low scan-in signal scan_n that is asserted for a scan mode of operation The scan mode signal scan-in will thus be high during normal (non-scan) operation so that NAND gate 215 functions to invert the memory select signal cs_n into a latch input signal 216. An inverter 217 functions as discussed further herein to invert the latch input signal 216 to form an inverted version (clk_pl_inb) of the pass transistor control signal clk_pl_in. System-power-domain latch 205 functions to invert the clk_pl_inb signal to form the pass transistor control signal clk_pl_in.

As known in the latch arts, a latch is deemed to be "transparent" when an output signal of the latch changes in response to a change in an input signal to the latch. Conversely, a latch is deemed to be "closed" when the latch latches a binary state of the latch output signal such that the latch output signal does not change despite any changes in the latch input signal. With reference to system-power-domain latch 205, inverter 217 controls whether system-power-domain latch 205 is transparent. In particular, system-power-domain latch 205 is only transparent when inverter 217 has both power and ground. To control whether system-power-domain latch 205 is transparent or closed, a clock path circuit 210 generates a pair of internal clock signals clk1 and clk2 responsive to the system clock signal clk. As will be explained further herein, internal clock signal clk1 (which is also denoted herein as a first internal clock signal) is asserted to the system power supply voltage vddcx when both the system clock signal clk is low (grounded) and the self-timed memory clock signal iclk is low (not that as defined herein, a signal is deemed to be "low" when discharged and to be "high" when charged to a power supply voltage). Conversely, internal clock signal clk2 (which is also denoted herein as a second internal clock signal) is low when the first internal clock signal clk1 is high. An inverter 217 formed by a serial combination of a p-type metal-oxide semiconductor (PMOS) inverter transistor P2 and an n-type metal-oxide semiconductor (NMOS) inverter transistor M2 is powered when the internal clock signal clk1 is high and the internal clock signal clk2 is low. In particular, a source of transistor M2 couples to ground through an NMOS transistor M1 controlled by the internal clock signal clk1. Similarly, a source of transistor P2 couples to a node for the system power supply voltage vddcx through a PMOS transistor P1 controlled by the internal clock signal clk2. Inverter 217 will thus be powered and grounded when the system clock signal clk and the self-timed memory clock signal iclk are both low so that inverter 217 inverts the latch input signal 216 into the clk_pl_inb signal that is latched and inverted in system-power-domain latch 205 to form the pass transistor control signal clk_pl_in.

System-power-domain latch 205 is thus transparent and passes the latch input signal 216 (through two inversions as discussed further herein) to form the pass transistor control clk_pl_inb when the system clock signal clk and the self-timed memory clock signal iclk are both low. Since the latch input signal 216 is an inverted version of the memory select signal cs_n, the pass transistor control signal clk_pl_in is asserted when the memory select signal is asserted and system-power-domain latch is transparent. A NOR gate 220 NORs the signal clk_pl_inb with the self-timed memory clock signal iclk. Inverter 217 functions as a first inverter and NOR gate 220 thus functions as a second inverter in system-power-domain latch 205 to invert the clk_pl_inb signal when the self-timed memory clock signal iclk is reset (discharged to ground) to form the pass transistor control signal clk_pl_in. The pass transistor control signal clk_pl_in is thus asserted to the system power supply signal vddcx when the memory select signal cs_n is asserted and system-power-domain latch 205 is transparent. System-power-domain latch 205 closes when either the self-timed memory clock signal iclk and/or the system clock signal is asserted because inverter 217 is then cut off from power and ground since both transistors P1 and M1 will be switched off. At the same time, an inverter 225 formed by a serial combination of a PMOS transistor P4 and an NMOS transistor M4 then receives power and ground. The source of transistor M4 couples to ground through an NMOS transistor M3 controlled by the internal clock signal clk2. Similarly, the source of transistor P4 connects to a node for the system power supply voltage vddcx through a PMOS transistor P3 controlled by the internal clock signal clk1. Inverter 225 will thus be powered and grounded so that system-power-domain latch 205 latches the pass transistor control signal clk_pl_in when the internal clock signal clk1 is low and the internal clock signal clk2 is high (system-power-domain latch 205 being closed). The output of inverter 225 drives an input to NOR gate 220. Since the output of NOR gate 220 drives the input to inverter 225 (the gates of transistors P4 and M4), NOR gate 220 and inverter 225 are cross-coupled and thus latch the pass transistor control signal clk_pl_in when system-power-domain latch 205 is closed.

As will be explained further herein, an inverted clock signal vssg in clock path circuit 210 is an inverted and level-shifted version of the system clock signal clk. The inverter clock signal vssg is a memory-power-domain signal whereas the system clock signal is a system-power-domain signal. Clock path circuit 210 includes an inverter 230 that inverts the inverted clock signal vssg to form a vssg complement signal (vssg_n) that is NORed in a NOR gate 235 with the self-timed memory clock signal iclk. The output signal of NOR gate 235 is level-shifted from the memory power domain to the system power domain by an MX-to-CX level-shifter (LS) 240, wherein MX denotes the memory power supply voltage vddmx and CX denotes the system power supply voltage vddcx. Level-shifter 240 is also denoted herein as a memory-power-domain-to-the-system-power-domain level shifter. An inverter 245 inverts an output signal of MX-to-CX level-shifter 240 to drive a NOR gate 250 that also NORs the system clock signal clk. The output of NOR gate 250 forms the internal clock signal clk1 that is inverted by an inverter 255 to form the internal clock signal clk2. The internal clock signals clk1 and clk2 are thus gated by the self-timed memory clock signal iclk through the action of NOR gate 235.

It is only when the self-timed memory clock signal iclk is reset low that the internal clock signal clk1 can go low and the internal clock signal clk2 can go high to cause system-power-domain latch 205 to be transparent. This is quite advantageous with respect to preventing a DC current loss that may otherwise exist for NOR gate 220 for a corner condition when the system power supply voltage vddcx is relatively high (e.g., 1.082V) while the memory power supply voltage vddmx is relatively low (e.g., 0.635V). At such a high CX, low MX corner condition, it could be the case that the self-timed memory clock signal iclk is still asserted but a new asserted value of the memory select signal cs_n is presented. The clk_pl_inb signal would then be grounded while the self-timed memory clock signal iclk is high. But this high value for the self-timed memory clock signal iclk is effectively a zero for a PMOS transistor (not illustrated) within NOR gate 220. This PMOS transistor then forms part of a DC current path through NOR gate 220 that would undesirably waste power. But the gating by NOR gate 235 prevents system-power-domain latch 205 from being transparent until the self-timed memory clock signal iclk is reset to advantageously prevent this DC current loss in NOR gate 220.

Operation of the second portion 260 of level-shifting pulse latch 105 will now be discussed. An inverter 270 and an inverter 275 form a memory-power-domain latch 280 for latching the self-timed memory clock signal iclk. An NMOS pass transistor M7 as controlled by the pass transistor control signal clk_pl_in from system-power-domain latch 205 controls whether the inverted clock signal vssg can pass as a latch input signal iclk_n carried on an input signal node 271 to memory-power-domain latch 280. When the memory select signal cs_n is asserted low and system-power-domain latch 205 is transparent, the pass transistor control signal clk_pl_in is asserted to switch on pass transistor M7 and allow the inverted clock signal vssg to pass to form the latch input signal iclk_n for memory-power-domain latch 280. Inverter 270 in memory-power-domain latch 280 inverts the latch input signal iclk_n to form the self-timed memory clock signal iclk.

A CX-to-MX level-shifter 265 inverts and level-shifts the system clock signal clk from the system power domain to the memory power domain to form the inverted clock signal vssg. An NMOS transistor M8 in CX-to-MX level-shifter 265 has its source connected to ground and its gate controlled by the system clock signal clk. The drain of transistor M8 forms a node for the inverted clock signal vssg. The inverted clock signal vssg is thus grounded through transistor M8 when the system clock signal clk is asserted. If pass transistor M7 is on because of an assertion of the pass transistor control signal clk_pl_in, then the input signal iclk_n is grounded to cause the self-timed memory clock signal iclk to be asserted. The self-timed memory clock signal iclk will thus be asserted in response to the assertion of the system clock signal clk if the memory was selected by the assertion of the memory select signal cs_n.

Prior to the reset of the self-timed memory clock signal iclk, the reset signal will still be in a de-asserted state by being charged to the memory power supply voltage vddmx so that an NMOS transistor M6 is on and a PMOS transistor P8 is off. The source of transistor M6 is connected to ground and its drain is connected to a source for an NMOS transistor M5 in inverter 275. The drain of transistor M5 is connected to input signal node 271. The self-timed memory clock signal iclk drives the gate of transistor M5 so that transistor M5 is on when the self-timed memory clock signal iclk is asserted. Since the reset signal has not yet been asserted low, the discharged latch input signal iclk_n on input signal node 271 is latched in memory-power-domain latch 280 through the reinforcing action of inverters 270 and 275 to latch the self-timed memory clock signal iclk. The self-timed memory clock signal iclk drives a gate of a PMOS transistor P7 and an NMOS transistor M5 in inverter 275. Transistor P7 has a drain connected to the drain of transistor M5 and also connected to the input signal node 271. Transistor P7 will thus be off when the self-timed memory clock signal iclk is asserted. After the memory function has been timed by self-timed circuit 125 of FIG. 1, the reset signal is asserted to switch off transistor M6 and switch on transistor P8. Transistor P8 has a source connected to a node for the memory power supply voltage vddmx and a drain connected to input signal node 271. The switching on of transistor P8 in response to the assertion low of the reset signal causes the input signal iclk_n to be charged to the memory power supply voltage vddmx, which in turn causes inverter 270 to discharge the self-timed memory clock signal iclk. The self-timed memory clock signal iclk is thus discharged in response to the assertion of the reset signal such that transistor P8 functions as a reset circuit. It will be appreciated that other types of reset circuits may be used to reset the self-timed memory clock signal iclk in place of transistor P8.

The source of transistor P7 couples to a power supply node for the memory power supply voltage vddmx through a pair of PMOS transistor P5 and P6 coupled in parallel. The sources for transistors P5 and P6 are connected to the power supply node for the memory power supply voltage vddmx whereas the drains for transistors P5 and P6 are connected to the source for transistor P7. The system clock signal clk drives the gate of transistor P6 whereas the pass transistor control signal clk_pl_in drives the gate of transistor P5. Thus, whenever the system clock signal clk is low or the memory is not selected, transistor P7 is powered so that the low state for the self-timed memory clock signal iclk switches on transistor P7 to reinforce the high state for the input signal iclk_n and latch the low state for the self-timed memory clock signal iclk in memory-power-domain latch 280.

In CX-to-MX level-shifter 265, the system clock signal clk drives a gate of a PMOS transistor P10 having its source connected to a power supply node for the memory power supply voltage vddmx and a drain connected to a source of a PMOS transistor P9. The drain of transistor M8 connects to the drain of transistor P9. The gate of transistor P9 is connected to a drain of a PMOS transistor P12 that in turn has a drain connected to a drain of an NMOS transistor M9. The source of transistor M9 is connected to ground and its gate is driven by an output of an inverter 285 that inverts the system clock signal clk. Transistor M9 will thus be off when the system clock signal clk is high. The output of inverter 285 also drives a gate of a PMOS transistor P11 having a source connected to a power supply node for the memory power supply voltage vddmx and having a drain connected to a source of transistor P12. The drain of transistor M8 is connected to the gate of transistor P12. Transistors P11 and P12 will thus both be on when the system clock signal clk is high to charge the gate of transistor P9 to ensure that transistor P9 is off. When the system clock signal clk goes low, transistor M9 switches on and transistors P11 and P12 switch off. Transistor P9 is then switched on by the discharge of the drain of transistor M9. Both transistors P9 and P10 are thus switched on by the low state of the system clock signal clk to charge the inverted clock signal vssg to the memory power supply voltage vddmx.

The level-shifting by CX-to-MX level-shifter 265 is quite advantageous in addressing a high CX, low MX corner condition such as at the power supply voltage levels discussed earlier. For example, suppose that the system clock signal was merely inverted to form a system-power-domain inverted clock signal vssg. If a low state (a binary zero) for the system clock signal clk was merely inverted without level shifting to form the system-power-domain inverted clock signal vssg while the reset signal is asserted and while the pass transistor control signal clk_pl_in is high, the source of pass transistor M7 would be relatively high compared to its drain such that pass transistor M7 would be on to pass the system-power-domain inverted clock signal vssg to input signal node 271. The system power supply voltage vddcx would then pass from input signal node 271 though transistor P7 and transistor P6 to discharge into the power supply node for the memory power supply voltage vddmx, resulting in a substantial power drain. But CX-to-MX level-shifter 265 prevents such a power discharge because the drain and source of pass transistor M7 would both be charged to the memory power supply voltage vddmx in such a corner scenario. There can then be no discharge from the system power domain to the memory power domain through pass transistor M7. An analogous CX-to-MX power discharge can occur at power-up through pass transistor M7 that is thwarted by CX-to-MX level-shifter 265. Level-shifting pulse latch 105 thus saves substantial power and has no restriction on input clock slew. In addition, CX-to-MX level-shifter 265 will advantageously increase the hold time for data output buffers (not illustrated) at low CX and high MX corners.

Figure 3:
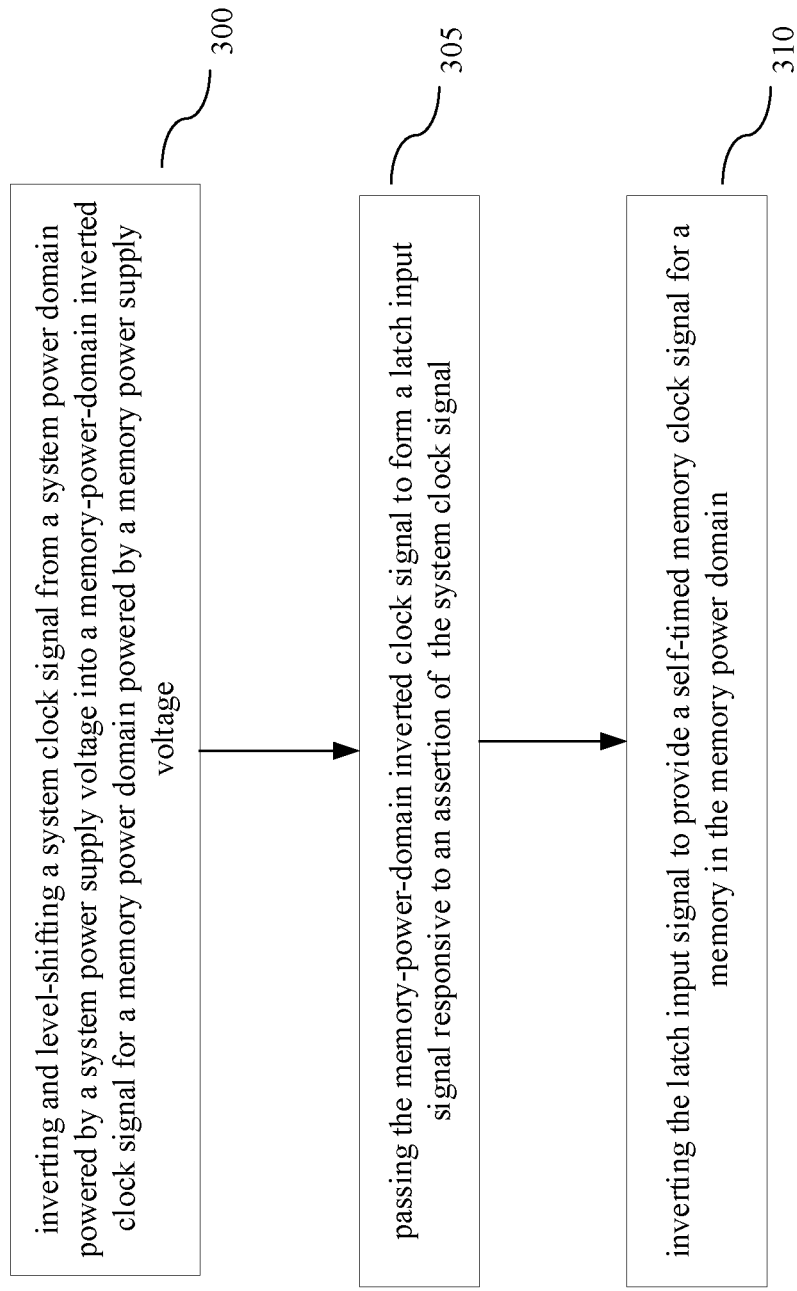
FIG. 3 is a flowchart for an example method of operation for a level-shifting pulse latch in accordance with an aspect of the disclosure.

A method of operation for a level-shifting pulse latch will now be discussed with reference to the flowchart of FIG. 3. The method includes a first act of inverting and level-shifting a system clock signal from a system power domain powered by a system power supply voltage into a memory-power-domain inverted clock signal for a memory power domain powered by a memory power supply voltage. The production of inverted clock signal vssg by CX-to-MX level-shifter 265 is an example of act 300. The method also includes an act 305 of passing the memory-power-domain inverted clock signal to form a latch input signal responsive to an assertion of both a memory select signal for the selection of a memory in the memory power domain and an assertion of a system clock signal from the system power domain. The control of pass transistor M7 by system-power-domain latch 205 to control whether the inverted clock signal vssg passes to drive input signal node 271 of memory-power-domain latch 280 is an example of act 305. Finally, the method includes an act 310 of inverting the latch input signal to provide a self-timed memory clock signal for the memory. The action of inverter 270 is an example of act 310.

Figure 4:
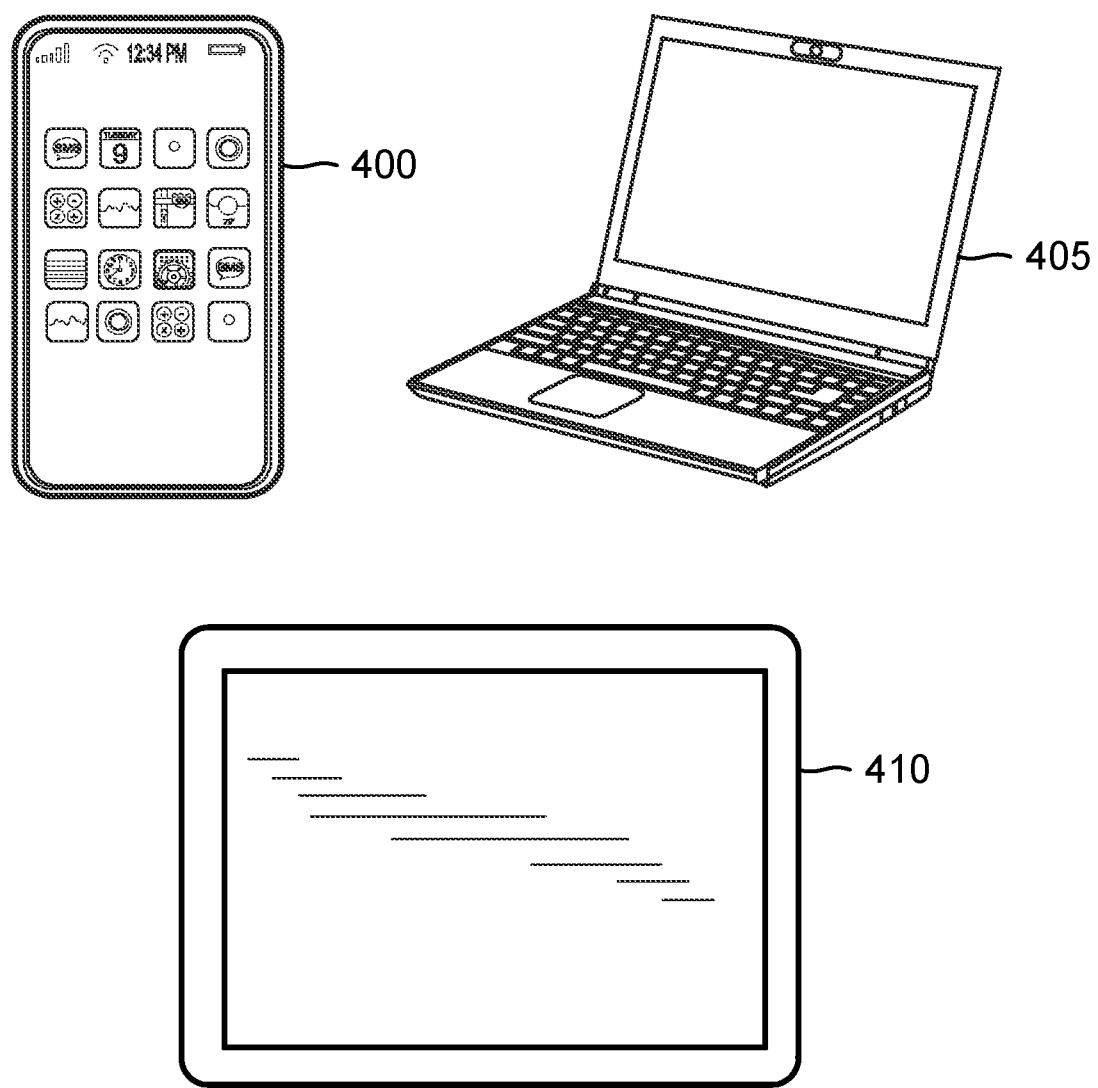
FIG. 4 illustrates some example electronic systems each incorporating a level-shifting pulse latch for a self-timed memory clock signal in accordance with an aspect of the disclosure.

A level-shifting pulse latch as disclosed herein may be advantageously incorporated in any suitable electronic system. For example, as shown in FIG. 4, a cellular telephone 400, a laptop computer 405, and a tablet PC 410 may all include a memory clocked by a self-timed memory clock signal as produced by a level-shifting pulse latch in accordance with the disclosure. Other exemplary electronic systems such as a music player, a video player, a communication device, and a personal computer may also be configured with level-shifting pulse latches constructed in accordance with the disclosure.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A level-shifting pulse latch, comprising:
a level-shifting inverter configured to invert and level-shift a system clock signal from a system power domain powered by a system power supply voltage into a memory-power-domain inverted clock signal for a memory power domain powered by a memory power supply voltage;
a pass transistor configured to switch on to pass the memory-power-domain inverted clock signal to form a latch input signal on an input signal node responsive to an assertion of both a memory select signal and the system clock signal; and
a memory-power-domain latch configured to latch the latch input signal to provide a self-timed memory clock signal for a memory.

2. The level-shifting pulse latch of claim 1, further comprising:
a reset circuit configured to charge the latch input signal to the memory power supply voltage responsive to an assertion of a reset signal.

3. The level-shifting pulse latch of claim 2, wherein the reset circuit comprises a p-type metal-oxide semiconductor (PMOS) transistor having a source connected to a power supply node for the memory power supply voltage and a drain connected to the input signal node.

4. The level-shifting pulse latch of claim 2, wherein the pass transistor is a first n-type metal-oxide semiconductor (NMOS) transistor having a drain connected to the input signal node, and wherein the level-shifting inverter includes a second NMOS transistor having a source connected to ground, a drain connected to a drain for the first NMOS transistor, and a gate connected to a node for the system clock signal.

5. The level-shifting pulse latch of claim 1, wherein the memory power domain latch is configured to invert the input latch signal to form the self-timed memory clock signal.

6. The level-shifting pulse latch of claim 1, further comprising
a system-power-domain latch configured to latch the memory select signal to form a pass transistor control signal, wherein the system-power-domain latch is configured to be transparent while the memory-power-domain inverted clock signal is discharged and a reset signal is not asserted, and to be closed while the system clock signal is charged to the system power supply voltage, and wherein the pass transistor is configured to switch on in response to an assertion of the pass transistor control signal by the system-power-domain latch.

7. The level-shifting pulse latch of claim 6, wherein the system-power-domain latch includes a NOR gate configured to NOR the self-timed memory clock signal with an inverted latch input signal to produce the pass transistor control signal.

8. The level-shifting pulse latch of claim 7, wherein the reset signal is an active-low reset signal.

9. The level-shifting pulse latch of claim 8, further comprising:
a clock path circuit including a first logic gate configured to invert the system clock signal to form a first internal clock signal and including a first inverter configured to invert the first internal clock signal to form a second internal clock signal, and wherein the system-power-domain latch is configured to be transparent responsive to the first internal clock signal being charged to the system power supply voltage and to the second internal clock signal being discharged.

10. The level-shifting pulse latch of claim 9, further comprising:
a NAND gate configured to NAND the memory select signal with a scan-in signal to form a latch input signal;
a second inverter formed by a first NMOS transistor in series with a first PMOS transistor and configured to invert the latch input signal to form the inverted latch input signal;
a second NMOS transistor having a source connected to ground and a drain connected to a drain for the first NMOS transistor, wherein a gate for the second NMOS transistor is configured to be controlled by the first internal clock signal; and
a second PMOS transistor having a source connected to a power supply node for the system power supply voltage and having a drain connected to a source for the first PMOS transistor, wherein a gate for the first PMOS transistor is configured to controlled by the second internal clock signal.

11. The level-shifting pulse latch of claim 10, wherein the system power domain and the memory power domain are integrated into a system-on-a-chip.

12. The level-shifting pulse latch of claim 11, wherein the system-on-a-chip is integrated into a cellular telephone.

13. The level-shifting pulse latch of claim 9, wherein the clock path circuit includes a second inverter configured to invert the memory-power-domain inverted clock signal;
a second logic gate configured to process an output signal from the second inverter with the self-timed memory clock signal;
a memory-power-domain-to-the-system-power-domain level-shifter configured to level shift an output signal from the second logic gate into a level-shifted output signal; a third inverter configured to invert the level-shifted output signal, wherein the first logic gate is configured to process the system clock signal and an output signal from the third inverter to form the first internal clock signal.

14. The level-shifting pulse latch of claim 13, wherein the first logic gate is a first NOR gate and the second logic gate is a second NOR gate.

15. A method of operation for a level-shifting pulse latch, comprising:
inverting and level-shifting a system clock signal from a system power domain powered by a system power supply voltage to form a memory-power-domain inverted clock signal for a memory power domain powered by a memory power supply voltage;
passing the memory-power-domain inverted clock signal to form a latch input signal responsive to an assertion of both a memory select signal and of the system clock signal; and inverting the latch input signal to provide a self-timed memory clock signal for a memory selected by the memory select signal.

16. The method of operation for a level-shifting pulse latch of claim 15, further comprising:
charging the latch input signal to the memory power supply voltage responsive to an assertion of a reset signal to discharge the self-timed memory clock signal.

17. The method of claim 16, further comprising:
asserting the reset signal responsive to a completion of a memory function following the assertion of the system clock signal.

18. The method of claim 17, wherein the asserting of the reset signal comprises discharging the reset signal to ground.

19. A level-shifting pulse latch, comprising:
a system-power-domain latch configured to latch a memory select signal to form a pass transistor control signal;
a clock path circuit configured to produce a pair of internal clock signals to control the system-power-domain latch to be transparent while a system clock signal is discharged and a reset signal is not asserted, and to control the system-power-domain latch to be closed while the system clock signal is charged to a system power supply voltage;
a pass transistor configured to switch on to pass an inverted version of the system clock signal to form a latch input signal on an input signal node responsive to an assertion of the pass transistor control signal, and
a memory-power-domain latch configured to latch the latch input signal to provide a self-timed memory clock signal for a memory.

20. The level-shifting pulse latch of claim 19, further comprising a reset circuit configured to charge the latch input signal to a memory power supply voltage responsive to an assertion of the reset signal.

21. The level-shifting pulse latch of claim 19, further comprising:
a level-shifting inverter configured to invert and level-shift the system clock signal into a memory-power-domain inverted clock signal to form the inverted version of the system clock signal.

22. The level-shifting pulse latch of claim 21, wherein the clock path circuit includes:
a first inverter configured to invert the inverted version of the system clock signal.

23. The level-shifting pulse latch of claim 22, wherein the clock path circuit further includes:
a first logic gate configured to process the self-timed memory clock signal and an output signal from the first inverter.

24. The level-shifting pulse latch of claim 23, wherein the clock path circuit further includes:
a memory-power-domain-to-the-system-power domain level-shifter configured to level shift an output signal from the first logic gate.

25. The level-shifting pulse latch of claim 19, further comprising:
a NAND gate configured to NAND the memory select signal with a scan-in signal to form a latch input signal for the system-power-domain latch.

* * * * *